United States Patent [19]

Stengl et al.

[11] Patent Number: 4,980,742

[45] Date of Patent: Dec. 25, 1990

[54] TURN-OFF THYRISTOR

[75] Inventors: Reinhard Stengl, Munich; Klaus G. Oppermann, Holzkirchen, both of Fed. Rep. of Germany

[73] Assignee: Siemens Aktiengesellschaft, Berlin and Munich, Fed. Rep. of Germany

[21] Appl. No.: 335,362

[22] Filed: Apr. 10, 1989

[30] Foreign Application Priority Data

May 31, 1988 [DE] Fed. Rep. of Germany ....... 3818516

[51] Int. Cl.$^5$ .................... H01L 29/74; H01L 29/747
[52] U.S. Cl. ......................................... 357/38; 357/39
[58] Field of Search .................... 357/38, 38 A, 38 C, 357/38 E, 38 G, 38 L, 38 LA, 38 P, 38 S, 38 T, 39, 39 A, 39 C, 39 E, 39 P, 39 L, 39 LA

[56] References Cited

U.S. PATENT DOCUMENTS

| | | |
|---|---|---|
| 4,171,995 | 10/1979 | Nishizawa et al. .................... 357/38 |
| 4,224,634 | 9/1980 | Svedberg . |
| 4,517,582 | 5/1985 | Sittig ..................................... 357/38 |

FOREIGN PATENT DOCUMENTS

0009367A1 9/1979 European Pat. Off. .
0102065 5/1986 Japan ................................. 357/38

OTHER PUBLICATIONS

Katz, Margalit, Yariv; Electrical Properties of Multi-p—n Junction Devices; 1982 IEEE, pp. 977–984.
"Electrical Properties of Multi P—N Junction Devices", by Joseph Katz et al., IEEE Transactions On Electron Devices, vol. ed—29; No. 6, Jun., 1982, pp. 977–984.

Primary Examiner—Rolf Hille
Assistant Examiner—Wael Fahmy

[57] ABSTRACT

A turn-off thyristor whereby an n-base layer not contacted by a gate electrode has at least one thin semiconductor layer inserted into it that is oppositely doped. Its distance from a pn-junction between a p-base and the n-base is selected so small that the maximum field strength of the space charge zone building up at this pn-junction upon turn-off of the thyristor is limited to a non-critical value at which an avalanche breakdown with respect to the charge carriers to be cleared out does not yet occur.

10 Claims, 3 Drawing Sheets

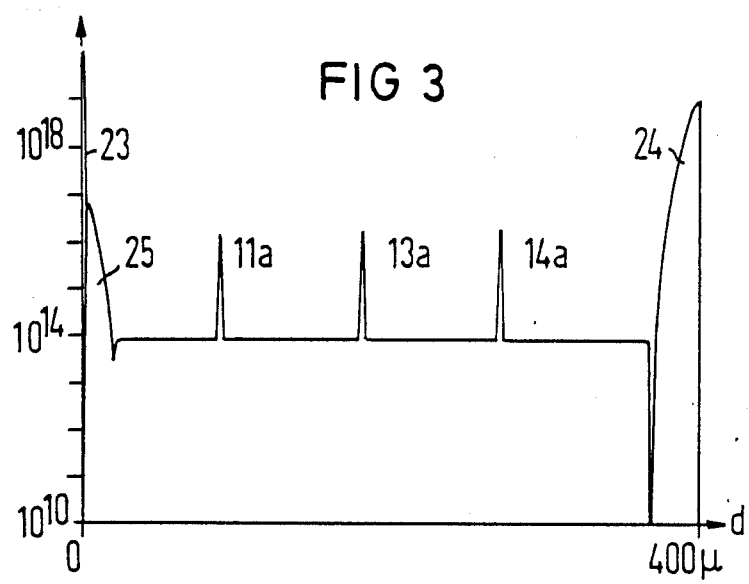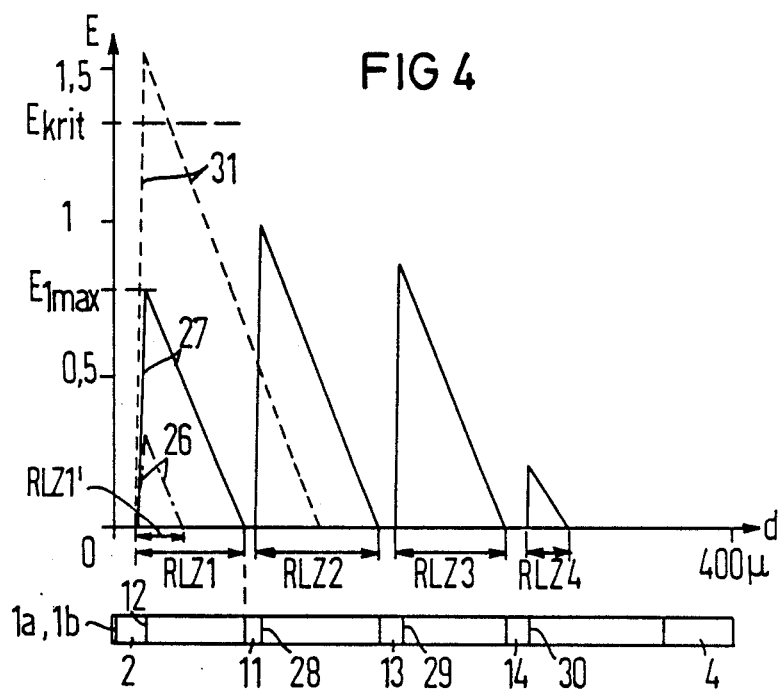

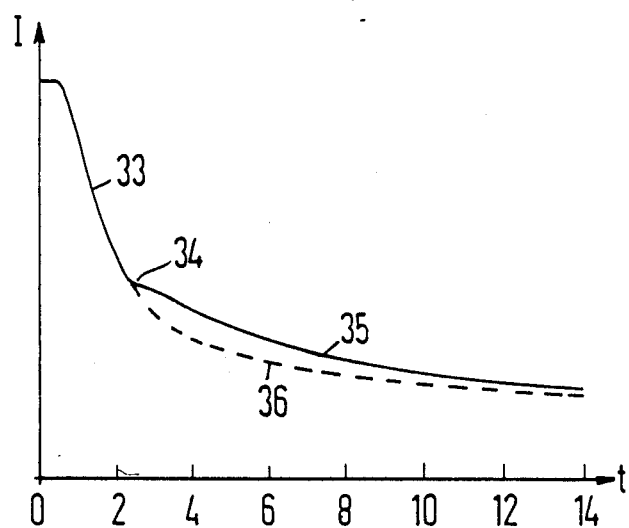

TURN-OFF THYRISTOR

BACKGROUND OF THE INVENTION

The present invention is directed to a turn-off thyristor.

Thyristors of this type are known in the prior art, for example European reference No. EP-A 0 009 369 and an article by M. Stoisiek and H. Strack, "MOS GTO-a TurnOff Thyristor with MOS-Controlled Emitter Shorts", published in the IEDM Report 1985, pages 158 through 161. When such thyristors are turned off, the turn-off current noticeably decreases for an increase in the voltage between an electrode at the anode side and an electrode at the cathode side.

SUMMARY OF THE INVENTION

An object of the present invention is to provide a thyristor of the type initially cited that provides the turn-off at a higher current than is the case for traditional thyristors. This also occurs at higher values of the anode-cathode voltage.

The present invention is utilized in a turn-off thyristor having a semiconductor body that has at least one n-emitter layer that is contacted by an electrode at the cathode side and has an adjoining p-base layer, and that has a p-emitter layer that is contacted by an electrode at the anode side and has an adjoining n-base layer. The n-base and p-base layers are separated from one another by a pn-junction that inhibits in the blocking condition of the thyristor. One of the base layers is provided with a ga&e electrode to which a quench voltage pulse effecting the turn-off of the thyristor can be supplied. The present invention is at least one thin semiconductor layer, extending essentially parallel to the pn-junction and doped opposite the other of the base layers, which is inserted into the other of the base layers that is not contacted by the gate electrode. The distance of the thin semiconductor layer from the pn-junction is so small that the maximum field strength of the space charge zone building up at this pn-junction upon turn-off of the thyristor is limited to a value that is below a critical value ($E_{krit}$) that leads to an avalanche breakdown with respect to the charge carriers to be cleared out upon turn-off.

In an alternative embodiment of the present invention at least one n-emitter layer is provided with at least one edge-side MIS-FET structure, the latter being composed of a first semiconductor region having a first conductivity type that is connected to the at least one n-emitter layer in an electrically conductive fashion, of a second semiconductor region of the first conductivity type that is connected to an adjoining one of the base layers in a conductive fashion, and of a channel region having a second conductivity type and lying between the first and second regions that is covered by a gate separated from the surface of the channel region by a thin, electrically insulating layer. The gate is charged with a quench voltage pulse that effects the turn-off of the thyristor. At least one thin semiconductor layer, extending essentially parallel to the pn-junction and doped opposite the other of the base layers, is inserted into the other of the base layers and that is not conductively connected to the second semiconductor region.

For a plurality of thin semiconductor layers inserted into the other of the base layers and doped opposite thereto, the distances between these thin semiconductor layers are so small that the maximum field strengths of the respective space charge zones building up between the thin semiconductor layers upon turn-off of the thyristor are limited to values that lie below the critical value ($E_{krit}$). Further the plurality of thin semiconductor layers inserted into the other of the base layers and doped opposite thereto may be provided with through recesses whose dimensions in a lateral direction are small in comparison to the thickness of the respectively adjoining space charge zones building up upon turn-off of the thyristor. The recesses may be located in the plurality of thin semiconductor layers such that a lattice-shaped structure of these semiconductor layers results. In a preferred embodiment one of the base layers is the p-base layer and the other of the base layers is the n-base layer.

An advantage of the present invention is that significantly higher load currents flowing through the transistor can be turned off by supplying a quench voltage pulse to the gate electrode or to the gate of the MIS emitter-base short structure than was hitherto possible.

IEEE Trans. on Electron Devices, Vol. EE-29, No. 6, 6/1982, pages 977 through 984 discloses a multi-pnsemiconductor structure that is composed of a sequence of semiconductor layers of alternating conductivities having an anode contact at a first p-conductive layer at one end side and having a cathode contact at a second n-conductive layer at the other end side. What is important is to compare the breakdown voltage of a pn-structure operated in a reverse condition with that of a multi-pn-structure. The improving of the turn-off behavior of turn-off thyristors, however, cannot be derived from this publication.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several FIGS in which like reference numerals identify like elements, and in which:

FIG. 3 is a graph showing the doping profile of the thyristors of FIG. 1 or FIG. 2;

FIG. 4 is a graph of a field strength distribution that occurs when the thyristors of FIG. 1 or FIG. 2 are turned off; and FIG. 5 is a graph of the time dependency of the turn-off current for the thyristors of FIG. 1 or FIG. 2.

DESCRIPTION OF THE PREFERRED EMBODIMENT

Figure 1:
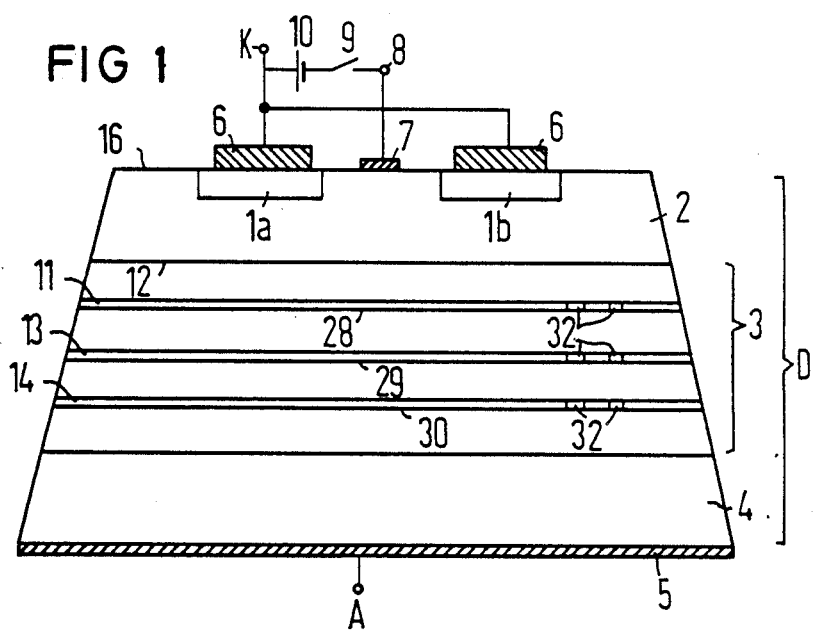
FIG. 1 depicts a turn-off thyristor according to the present invention.

FIG. 1 shows a turn-off thyristor having a semiconductor body composed of doped semiconductor material, for example silicon. It has four successive layers of alternating conductivity types. Of these the layer composed of the two n-conductive partial layers 1a and 1b is referred to as the n-emitter. The p-conductive layer 2 is referred to as the p-base. The n-conductive layer 3 is referred to as the n-base and the p-conductive layer 4 is referred to as the p-emitter. The p-emitter is provided with an electrode 5 on the anode side composed of electrically conductive material, for example aluminum, that has a terminal A. The n-emitter is contacted by an electrode 6 on the cathode side composed of electrically conducted material, for example aluminum, and provided with a terminal K. A gate electrode 7 provided with a terminal 8 contacts the p-base 2. When the thyristor is triggered an ignition voltage plus $U_Z$, that is positive in comparison to a potential on terminal K is supplied to the terminal 8. When the thyristor is turned off or quenched, a switch 9 is closed via which a voltage source 10 is connected between terminal K and terminal 8. The gate electrode 7 is thereby charged with a quench voltage pulse $-U_L$ that is negative in comparison to the potential or terminal K.

A p-doped semiconductor layer 11 is inserted into the n-base 3, this p-doped semiconductor layer 11 extending essentially parallel to the pn-junction referenced 12 between the p-base 2 and the n-base 3 and, compared to the thickness D of the semiconductor body which, for example, may amount to 400 μm, has only a slight thickness of, for example, 4 μm. Layers 13 and 14 reference further p-conductive semiconductor layers that are inserted into the n-base 3 under the semiconductor layer 11 such that they exhibit about the same spacing from one another as the semiconductor layer 13 exhibits from the semiconductor layer 11. The layer 11, 13 and 14 that are about equal in thickness are not connected to external potentials but represent "floating" semiconductor layers.

Figure 2:
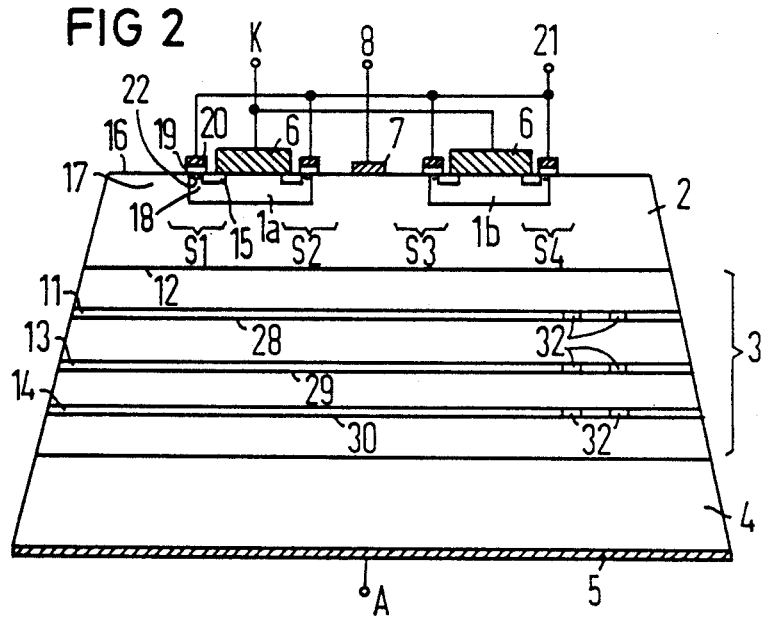
FIG. 2 depicts a further turn-off thyristor according to the present invention.

FIG. 2 shows a further turn-off thyristor whose parts corresponding to the parts of the thyristor of FIG. 1 are provided with the same reference characters. Differing from FIG. 1, a p-conductive semiconductor region 15 is inserted into the partial layer 1a of the n-emitter, this p-conductive semiconductor region 15 extending up to the upper boundary surface 16 of the semiconductor body and being contacted by the electrode 6. The region 15 forms a MIS-FET structure together with a further p-conductive semiconductor region 17 that is composed of a sub-region of the p-base 2 adjoining the partial layer 1a and together with a n-conductive channel region 18 lying between regions 15 and 17 that is covered by a gate 20 separated from the boundary surface 16 by an electrically insulating layer 19. This MIS-FE structure can be controlled via terminal 21 of the gate 20. In a first switch condition of this structure, a gate voltage is applied to terminal 21, this gate voltage being more negative than the threshold voltage of the channel 18. An inversion channel 22 is formed in the channel region 18 under gate 20, this inversion channel 22 connecting the region 15 and, thus, the electrode 6 to the region 17 and, thus, the p-base 2 in a low-resistant fashion, i.e. the pn-junction between the partial layer 1a of the n-emitter and p-base 2 is practically shorted. In a second switch condition of this MIS-FET structure, the terminal 21 has a voltage that exceeds the threshold voltage of the channel region 18. The inversion channel 22 is thereby not present, so that the low-resistant connection or the short between regions 15 and 17 and, thus, between layer 1a and p-base 2 is eliminated. In addition to the MIS-FET structure that has already been set forth and that is referenced S1 in FIG. 2, further analogously constructed MIS-FET structures S2 through S4 are also provided at the righthand edge of the partial layer 1a and at the edges of the right-hand partial layer 1b.

For igniting the thyristor of FIG. 2, the terminal 8 is again provided with a positive ignition voltage $+U_z$, whereby the structures S1 through S4 must be respectively situated in the second switch condition. Differing from FIG. 1, the turn-off does not occur via the terminal 8 but by supplying a negative quench voltage pulse $-U_Z$ to the terminal 21, by which the structures S1 through S4 are switched into the first switch condition in which the pn-junctions between layer 1a and p-base 2 as well as between layer 1b and p-base 2 are practically shorted.

FIG. 3 shows the doping profile of the thyristors according to FIGS. 1 or 2 in a diagram in which the doping concentrations of the individual semiconductor regions are entered over the distance d from the boundary surface 16 of the semiconductor body. The doping concentrations of the n-emitter and of the p-emitter that each amount to about $10^{-19}$ cm$^{-3}$ are each identified by the profile sections 23 and 24; the doping concentration of the p-base that amounts to about 10-17 cm$^{-3}$ is identified by the profile section 25. The p-conductive semiconductor layers 11, 13, 14 inserted into the n-base doped with $10^{-14}$ cm$^{-3}$ are indicated by the profile sections 11a, 13a and 14a. As may be seen, the doping concentration for these layers amounts to about $10^{-15}$ through $10^{-16}$ cm$^{-3}$.

In the ignited or current-conducting condition of a turn-off thyristor according to FIG. 1 or FIG. 2, all inhibiting pn-junctions are flooded with mobile charge carriers, so that a low flow resistance results for the load current flowing from terminal A to terminal K.

When, for turning off a thyristor according to FIG. 1, a negative quench voltage pulse $-U_L$ is applied to the gate electrode 7 or when, for turning off a thyristor according to FIG. 2, such a pulse is applied to the terminal 21. Then the mobile charge carriers are first eliminated from the p-base 2, whereby the pn-junction 12 between the p-base 2 and the n-base 3 is ultimately polarized in non-conducting direction. A space charge zone RLZI is, gradually built up at the pn-junction 12.

The distribution of the field strength E (indicated in $10^5$ V/cm) of the electrical field present in the interior of the space charge zone RLZ1 and caused by an anode-cathode voltage applied between the terminals A and K is shown in FIG. 4 over the distance d from the boundary surface 16, Given the gradual build-up of RLZ1, an intermediate stage is first achieved wherein the space charge zone exhibits a width of RLZ1' and wherein the field strength distribution is established by the two dot-dash straight lines 26. The maximum field strength lying at the intersection of these straight lines amounts to about 0.3 $10^5$V/cm. The further build-up of RLZ1 can only occur until a field strength distribution is achieved that is established by the straight lines 27, since the limitation of RLZ1 exhibiting the greater distance d just reaches the upper boundary surface between the layer 11 and the n-base 3. This proceeds from a cross section of the thyristor shown under the graph in FIG. 4. Since the maximum field strength $E_{1max}$ defined by the intersection of the straight lines cannot be exceeded because of the layer 11, a critical field strength $E_{krit}$ is avoided at which the charge carriers passing through RLZ1 would be exposed to an avalanche effect as a result whereof new charge carrier pairs could arise and the space charge zone RLZ1 would assume the function of a back-up emitter. A turn-off of the thyristor would thereby be no longer possible. The creation of a back-up emitter in the region of RLZ1 is thus avoided due to the presence of the layer 11.

Following the formation of RLZI, the space charge zone RLZ2 at the pn-junction 28 between the layer 11 and n-base 3, the space charge zone RLZ3 at the pn-junction 29 between the layer 13 and n-base 3, and the space charge zone RLZ4 at the pn-junction 30 between the layer 14 and n-base 3 are successively built up. Here, too, the creation of back-up emitters is avoided in that RLZ2 can expand only up to the layer 13 and RLZ3 can expand only up to the layer 14, so that $E_{krit}$ is not reached in these space charge zones. Since the anode-cathode voltage applied between terminals A and K is already essentially compensated for by the differences in potential appearing in RLZI through RLZ3, only such a small part of the anode-cathode voltage remains for RLZ4 that RLZ4 is narrower than the remaining space charge zones, so that $E_{krit}$ is also not reached here.

If the semiconductors layers 11, 13 and 14 were not present, the entire anode-cathode voltage applied between terminals A and K would have to be compensated in a single space charge zone building up at the pn-junction 12, and this would lead to a field strength distribution indicated by the broken straight lines 31. $E_{krit}$, however, would thereby be exceeded, so that a reliable turn-off of the thyristor could no longer occur.

When a higher load current is to be shut off than was previously assumed, then the straight line pairs 26, 27, etc., must have greater steepness. In this case, too, maximum field strengths that lie above $E_{krit}$ can be avoided, for example by reducing the distances between the layers 2, 11, 13 and 14.

For applications wherein lower load currents are to be turned off or lower anode-cathode voltage are prescribed, the plurality of semiconductor layers 11, 13 14 can be reduced, for example to a single semiconductor layer, whereas, in the opposite case, a greater plurality of semiconductors layers can also be inserted into the n-base.

The embodiments of the present invention that have been considered up to now are augmented by further embodiments wherein measures are undertaken at the anode side in order to affect a clear-out of the charge carriers present in the base layers for turn-off of the thyristor. For example, a gate electrode contacting the n-base 3 or controllable in MIS-FET structures that serve as anode-base shorts are provided. The distances of the inserted semiconductor layers, for example layers 11, 13 and 14, from the p-emitter are &hereby selected so small that the space charge zones building up upon turn-off of the thyristor have no maximum field strengths that exceed $E_{krit}$. The same is true of thyristors that are intended to block in a reverse direction, whereby the anode terminal A lies at a lower potential than the cathode terminal K.

According to a further development of the present invention, the semiconductor layers, for example layers 11, 13 and 14, that are inserted into a base layer are provided with recesses 32 that penetrate them from their upper to their lower boundary surfaces. The dimensions of these recesses in a lateral direction can be smaller than the thicknesses of the space charge zone RLZl or RLZ4 (FIG. 4). As a result thereof, the ignition behavior of the thyristor is improved. Advantageously, the recesses 32 can be arranged in the individual semiconductor layers, for example layer 11, such that a lattice structure thereby derives.

FIG. 5 shows the dependency of the turn-off current I on the time t that is incremented in μs. A first, strongly dropping branch 33 of the turn-off current/time curve corresponds to the time span that is required for the build-up of RLZl. Due to the clear-out of the charge carriers from the layer 11, a phase 34 wherein the turn-off current remains constant follows thereupon. The curve branch 35 traversed thereafter corresponds to the build-up of the next space charge zone RLZ2. The further layers 13 and 14 that would lead to similar phases of constant turn-off current intensity, as at 34, are not taken into consideration here. The broken-line curve 36 corresponds to the turn-off current curve without the inserted layers 11, 13 and 14, whereby it is assumed that the turn-off current density is so low that the critical field strength $E_{krit}$ is not exceeded.

Further embodiments of the present invention result when all semiconductor regions or layers are replaced by those having the opposite conductivity type, whereby the supplied voltages are replaced by those having the opposite operational sign.

In a departure from the exemplary embodiments set forth with reference to FIG. 2, the MIS-FET structures ca also be respectively fashioned such that their first semiconductor region is composed of a part of the semiconductor layer 1a or 1b, its second semiconductor region is composed of a short-circuit region inserted into the p-base 2 and conductively connected to the p-base 2 by a conductive coating and such that its channel region covered by a gate is composed of that part of the p-base 2 lying between the semiconductor 1a or 1b and the short circuit region. Such MIS-FET structures are disclosed, for example, by U.S. Pat. No. 4,224,634.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A turn-off thyristor having a semiconductor body that has at least one n-emitter layer that is contacted by an electrode at the cathode side and has an adjoining p-base layer, and that has a p-emitter layer that is contacted by an electrode at the anode side and has an adjoining n-base layer, whereby the n-base and p-base layers are separated from one another by a pn-junction that inhibits in the blocking condition of the thyristor, whereby one of the base layers is provided with a gate electrode to which a quench voltage pulse effecting the turn-off of the thyristor can be supplied, comprising at least one thin semiconductor layer, extending essentially parallel to the pn-junction and doped opposite the other of the base layers, inserted into the other of the base layers that is not contacted by the gate electrode, the distance of the thin semiconductor layer from the pn-junction being so small that the maximum field strength of the space charge zone building up at this pn-junction upon turn-off of the thyristor is limited to a value that is below a critical value ($E_{krit}$) that leads to an avalanche breakdown with respect to the charge carriers to be cleared out upon turn-off.

2. A turn-off thyristor having a semiconductor body that has at least one n-emitter layer that is contacted by an electrode at the cathode side and that has an adjoining p-base layer and that has a p-emitter layer contacted by an electrode at the anode side and that has an adjoining n-base layer, whereby the n-base and p-base layers are separated from one another by a pn-junction that inhibits in the blocking condition of the thyristor, whereby at least one n-emitter layer is provided with at least one edge-side MIS-FET structure, the latter being composed of a first semiconductor region having a first conductivity type that is connected to the at least one n-emitter layer in an electrically conductive fashion, of a second semiconductor region of the first conductivity type that is connected to an adjoining one of the base layers in a conductive fashion, and of a channel region having a second conductivity type and lying between the first and second regions that is covered by a gate separated from the surface of the channel region by a thin, electrically insulating layer, said gate being charged with a quench voltage pulse that effects the turn-off of the thyristor, comprising at least one thin semiconductor layer, extending essentially parallel to the pn-junction and doped opposite the other of the base layers, inserted into the other of the base layers and that is not conductively connected to the second semiconductor region, the distance of the thin semiconductor layer from the pn-junction being so small that the maximum field strength of the space charge zone building u at this pn-junction upon turn-off of the thyristor is limited to a value that lies below a critical value ($E_{krit}$) which leads to an avalanche effect with respect to the charge carriers to be cleared out upon turn-off.

3. The turn-off thyristor according to claim 1 wherein for a plurality of thin semiconductor layers inserted into the other of the base layers and doped opposite thereto, the distances between these thin semiconductor layers being so small that the maximum field strengths of the respective space charge zones building up between the thin semiconductor layers upon turn-off of the thyristor are limited to values that lie below the critical value ($E_{krit}$)

4. The turn-off thyristor according to claim 3 wherein the plurality of thin semiconductor layers inserted into the other of the base layers an doped opposite thereto are provided with through recesses whose dimensions in a lateral direction are small in comparison to the thickness of the respectively adjoining space charge zones building up upon turn-off of the thyristor.

5. The turn-off thyristor according to claim 4, wherein the recesses are located in the plurality of thin semiconductor layers such that a lattice-shaped structure of these semiconductor layers results.

6. The turn-off thyristor according to claim 1, wherein the one of the base layers is the p-base layer and the other of the base layers is the n-base layer.

7. The turn-off thyristor according to claim 2 wherein, for a plurality of thin semiconductor layers inserted into the other of the base layers and doped opposite thereto, the distance between these thin semiconductor layers being so small that the maximum field strengths of the respective space charge zones building up between the thin semiconductor layers upon turn-off of the thyristor are limited to values that lie below the critical value ($E_{krit}$)

8. The turn-off thyristor according to claim 7, wherein, the plurality of the thin semiconductor layers inserted into the other of the base layers and doped opposite thereto are provided with through recesses whose dimensions in a lateral direction are small in comparison to the thickness of the respectively adjoining space charge zones building up upon turn-off the thyristor.

9. The turn-off thyristor according to claim 8, wherein, the recesses are located in the plurality of thin semiconductor layers such that a lattice-shaped structure of these semiconductor layers results.

10. The turn-off thyristor according to claim 2, wherein the one of the base layers is the p-base layer and the other of the base layers is the n-base layer.

* * * * *